United States Patent
Park

(10) Patent No.: US 8,145,968 B2
(45) Date of Patent: Mar. 27, 2012

(54) METHOD OF DETERMINING BINARY SIGNAL OF MEMORY CELL AND APPARATUS THEREOF

(75) Inventor: Hyun-soo Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1057 days.

(21) Appl. No.: 12/034,089

(22) Filed: Feb. 20, 2008

(65) Prior Publication Data

US 2009/0055700 A1 Feb. 26, 2009

(30) Foreign Application Priority Data

Aug. 23, 2007 (KR) .................... 10-2007-0085005

(51) Int. Cl.
*H04L 1/00* (2006.01)
*G06F 11/30* (2006.01)
*G08C 25/00* (2006.01)
*H03M 13/00* (2006.01)

(52) U.S. Cl. ............... 714/746; 714/773; 365/185.2; 365/185.22

(58) Field of Classification Search ............. 714/746, 714/773; 365/185.2, 185.22
See application file for complete search history.

(56) References Cited

U.S. PATENT DOCUMENTS

| | | | |
|---|---|---|---|
| 5,280,438 A | 1/1994 | Kanemaru | |
| 6,289,481 B1 | 9/2001 | Egawa | |
| 6,617,842 B2 | 9/2003 | Nishikawa et al. | |
| 6,678,860 B1 | 1/2004 | Lee | |
| 6,839,875 B2* | 1/2005 | Roohparvar | 714/773 |
| 7,139,864 B2 | 11/2006 | Bennett et al. | |
| 7,197,678 B2 | 3/2007 | Ohlhoff et al. | |
| 7,974,132 B2* | 7/2011 | Cornwell et al. | 365/185.2 |
| 2004/0218420 A1 | 11/2004 | Aakjer | |
| 2006/0171210 A1 | 8/2006 | Nagashima et al. | |
| 2008/0019188 A1* | 1/2008 | Li | 365/185.22 |
| 2010/0002774 A1 | 1/2010 | Kondo et al. | |

FOREIGN PATENT DOCUMENTS

| | | |
|---|---|---|
| TW | 417110 | 1/2001 |
| TW | 1222648 B | 1/2004 |
| TW | 1240278 B | 9/2005 |

OTHER PUBLICATIONS

PCT International Search Report and Written Opinion issued May 20, 2008 re: International Application No. PCT/KR2008/001153 (13 pp).

Taiwanese Preliminary Notice of the First Office Action issued Nov. 30, 2011, in counterpart Taiwanese Patent Application No. 097107828 (9 pp., including an English translation).

* cited by examiner

*Primary Examiner* — Guy Lamarre
(74) *Attorney, Agent, or Firm* — NSIP Law

(57) ABSTRACT

A method and apparatus to determine a binary signal of a memory cell capable of decreasing an error rate of binary signal determination that occur due to neighboring cells and noise, the apparatus including: a data collection unit to collect target data stored in a target cell in a memory and binary neighboring data of data stored in at least one neighboring cell that neighbors the target cell; a data correction unit to correct the target data collected from the target cell by using the target data and the binary neighboring data collected by the data collection unit and a parameter; and a binary signal determination unit to determine a binary signal of a corrected signal output from the data correction unit.

32 Claims, 9 Drawing Sheets

P[x,y]

R[x,y] FOR P[x,y]

H[x,y]

| 0 | 0 | 0 | 0 | 0 |
|---|---|---|---|---|
| 0 | 1 | 0 | 1 | 0 |
| 0 | 1 | 1 | 1 | 0 |
| 0 | 1 | 1 | 0 | 0 |
| 0 | 0 | 0 | 0 | 0 |

| 0.2804 | 0.3980 | 0.4525 | 0.3985 | 0.2977 |
|---|---|---|---|---|
| 0.4008 | 1.0668 | 0.5488 | 0.9995 | 0.4103 |
| 0.3717 | 1.0922 | 1.2913 | 1.0224 | 0.3192 |
| 0.4587 | 1.1389 | 1.1056 | 0.5776 | 0.4180 |
| 0.3249 | 0.6309 | 0.2893 | 0.5363 | 0.0635 |

R[x,y] FOR P[x,y]

FIG. 7C

| 0 | 0 | 0 | 0 | 0 |
|---|---|---|---|---|
| 0 | 1.1114 | −0.0020 | 0.9992 | 0 |
| 0 | 0.9869 | 1.1522 | 0.9540 | 0 |
| 0 | 1.1482 | 1.0093 | 0.2127 | 0 |
| 0 | 0 | 0 | 0 | 0 |

P[x,y] OBTAINED BY CORRECTING R[x,y]

FIG. 7D

| 0 | 0 | 0 | 0 | 0 |
|---|---|---|---|---|
| 0 | 1 | 0 | 1 | 0 |
| 0 | 1 | 1 | 1 | 0 |
| 0 | 1 | 1 | 0 | 0 |
| 0 | 0 | 0 | 0 | 0 |

BINARY SIGNAL

METHOD OF DETERMINING BINARY SIGNAL OF MEMORY CELL AND APPARATUS THEREOF

CROSS-REFERENCE TO RELATED APPLICATION

This application claims the benefit of Korean Application No. 2007-85005, filed Aug. 23, 2007, in the Korean Intellectual Property Office, the disclosure of which is incorporated herein by reference.

BACKGROUND OF THE INVENTION

1. Field of the Invention

Aspects of the present invention relate to a method of and apparatus for determining a binary signal of a memory cell, and more particularly, to a method and apparatus for determining a binary signal of a memory capable of reducing an error rate of a binary signal stored in the memory cell.

2. Description of the Related Art

Memory may be categorized as a single level cell (SLC)-type memory capable of storing a 1-bit binary signal in one cell, or a multi level cell (MLC)-type memory capable of storing a multi-bit binary signal in one cell. In such a memory, a binary signal stored in a selected cell is determined by comparing a reference current generated in a reference cell operating according to a reference voltage with a cell current generated in the selected cell.

FIG. 1 is a diagram illustrating an example of determining a binary signal of one memory cell in an SLC-type memory according to conventional technology. Referring to FIG. 1, a cell current ($I_{CELL}$) generated in a selected cell 101 is a drain-source current, and WL indicates a word line. A reference cell 102 is biased by a reference voltage ($V_{REF}$) and generates a reference current ($I_{REF}$). A comparator 103 compares the cell current $I_{CELL}$ output from the selected cell 101 with the reference current $I_{REF}$ output from the reference cell 102, and outputs the comparison result as the cell state of the selected cell 101. The cell state output from the comparator 103 may be 1 or 0. If the memory is designed such that electrons are stored in a cell in the memory, the cell state is 1. Conversely, if electrons are not stored, the cell state is 0. That is, if the cell state output from the comparator 103 is 1, the electrons are stored in the selected cell 101, and if the cell state output from the comparator 103 is 0, it the electrons are not stored in the selected cell 101.

FIG. 2 is a diagram illustrating an example of determining a binary signal of a memory cell in an MLC-type memory according to conventional technology. As an example, the MLC-type memory illustrated in FIG. 2 stores a 2-bit binary signal in one memory cell. Accordingly, in the example illustrated in FIG. 2, a cell current ($I_{CELL}$) output from a selected cell 201 is determined in four divided stages. That is, a reference voltage is divided into V1, V2, and V3, and if the cell states 1, 2 and 3 output from comparators 205, 206, and 207, respectively, are all 0's to indicate that the cell current ($I_{CELL}$) generated in the selected cell 201 is less than a first reference current ($I_1$) output from a first reference cell 202 biased by V1, the bits stored in the selected cell 201 are recognized as 00. If the cell current is between the first reference current ($I_1$) and a second reference current ($I_2$), the cell states 1, 2, and 3 output from the comparators 205, 206, and 208, respectively, are 100, and thus the bits stored in the selected cell are recognized as 10. If the cell current is between the second reference current ($I_2$) and a third reference current ($I_3$), the cell states 1, 2, and 3 output from the comparators 205, 206, and 208, respectively, are 110, and thus the bits stored in the selected cell are recognized as 01. If the cell current is equal to or greater than the third reference current ($I_3$), the cell states 1, 2, and 3 output from the comparators 205, 206, and 208, respectively, are 111, and thus the bits stored in the selected cell are recognized as 11.

In this way, the binary signal stored in each memory cell is determined based on the cell state obtained by comparing a cell current output from a selected cell with one or more reference currents generated in one or more reference cells according to the number of bits stored in the memory cell.

However, while reading a binary signal from a selected cell, an error may occur in the binary signal read from the selected cell due to noise caused by any of a variety of reasons. In order to prevent an occurrence of this error, error correction techniques have been suggested. An example is a method of adding parity information. However, when parity information is added, part of a data area for storing data in the memory must be allocated, thereby decreasing available user data areas.

SUMMARY OF THE INVENTION

Aspects of the present invention provide a method and apparatus for determining a binary signal of a memory cell capable of decreasing an error rate of binary signal determination that may occur due to neighboring cells and noise.

According to an aspect of the present invention, there is provided an apparatus to determine a binary signal of a cell in a memory, the apparatus including: a data collection unit to collect target data stored in a target cell in the memory and binary neighboring data of data stored in at least one neighboring cell that neighbors the target cell; a data correction unit to correct the target data collected from the target cell by using the target data and the binary neighboring data collected by the data collection unit and parameter information; and a binary signal determination unit to determine a binary signal of a corrected signal output from the data correction unit.

The parameter information may include a parameter indicating a correlation between the target data stored in the target cell and the data stored in the at least one neighboring cell, and a parameter indicating a correlation between the target data recorded in the target cell and the target data reproduced from the target cell.

The data stored in the cell may be 1-bit information or greater than 1-bit information.

The apparatus may further include: a line decoder to generate a plurality of line selection signals in the memory from an address; and a column decoder to generate a plurality of column selection signals in the memory from the address in order to simultaneously transmit the target data stored in the target cell and the data of the at least one neighboring cell to the data collection unit.

The apparatus may further include a parameter calculation unit to calculate the parameter information in a predetermined area of the memory whenever the memory operates.

The memory may store the parameter information in a predetermined area.

According to another aspect of the present invention, there is provided a method of determining a binary signal of a cell in a memory, the method including: collecting target data stored in a target cell in the memory and binary neighboring data of data stored in at least one neighboring cell that neighbors the target cell; correcting the target data collected from the target cell by using the target data and the binary neighboring data and parameter information; and determining a binary signal of the corrected data.

According to another aspect of the present invention, there is provided an apparatus to correct data of a cell in a memory, the apparatus including: a data collection unit to collect target data stored in a target cell in the memory and binary neighboring data of data stored in at least one neighboring cell that neighbors the target cell; and a data correction unit to correct the target data collected from the target cell by using the target data and the binary neighboring data collected by the data collection unit and parameter information.

According to another aspect of the present invention, there is provided a memory storing data that is corrected by a correcting apparatus, the memory including: a target cell storing target data to be corrected by the correcting apparatus; at least one neighboring cell storing neighboring data to be used with the target data and parameter information by the correcting apparatus to correct the target data; and a test area on which the correcting apparatus calculates the parameter information by recording predetermined binary data thereon, reproducing the predetermined binary data therefrom, and comparing the actual predetermined binary data with the reproduced predetermined binary data.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 6 is a diagram illustrating H parameters obtained based on data illustrated in FIGS. 4 and 5 according to an embodiment of the present invention;

FIGS. 7A through 7D are diagrams illustrating a process of determining a binary signal of a memory cell by using the apparatus to determine a binary signal of a memory cell illustrated in FIG. 3 according to an embodiment of the present invention;

DETAILED DESCRIPTION OF THE EMBODIMENTS

Figure 1:
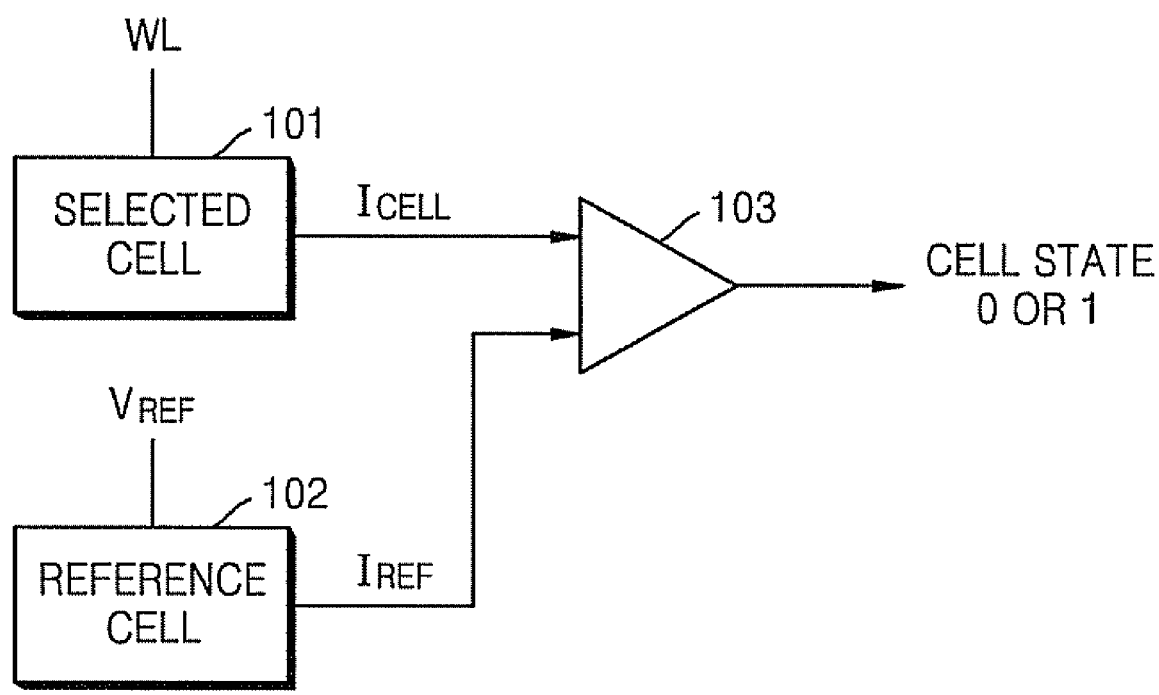
FIG. 1 is a diagram illustrating an example of determining a binary signal of one memory cell in a single level cell (SLC) type memory according to conventional technology.
Figure 2:
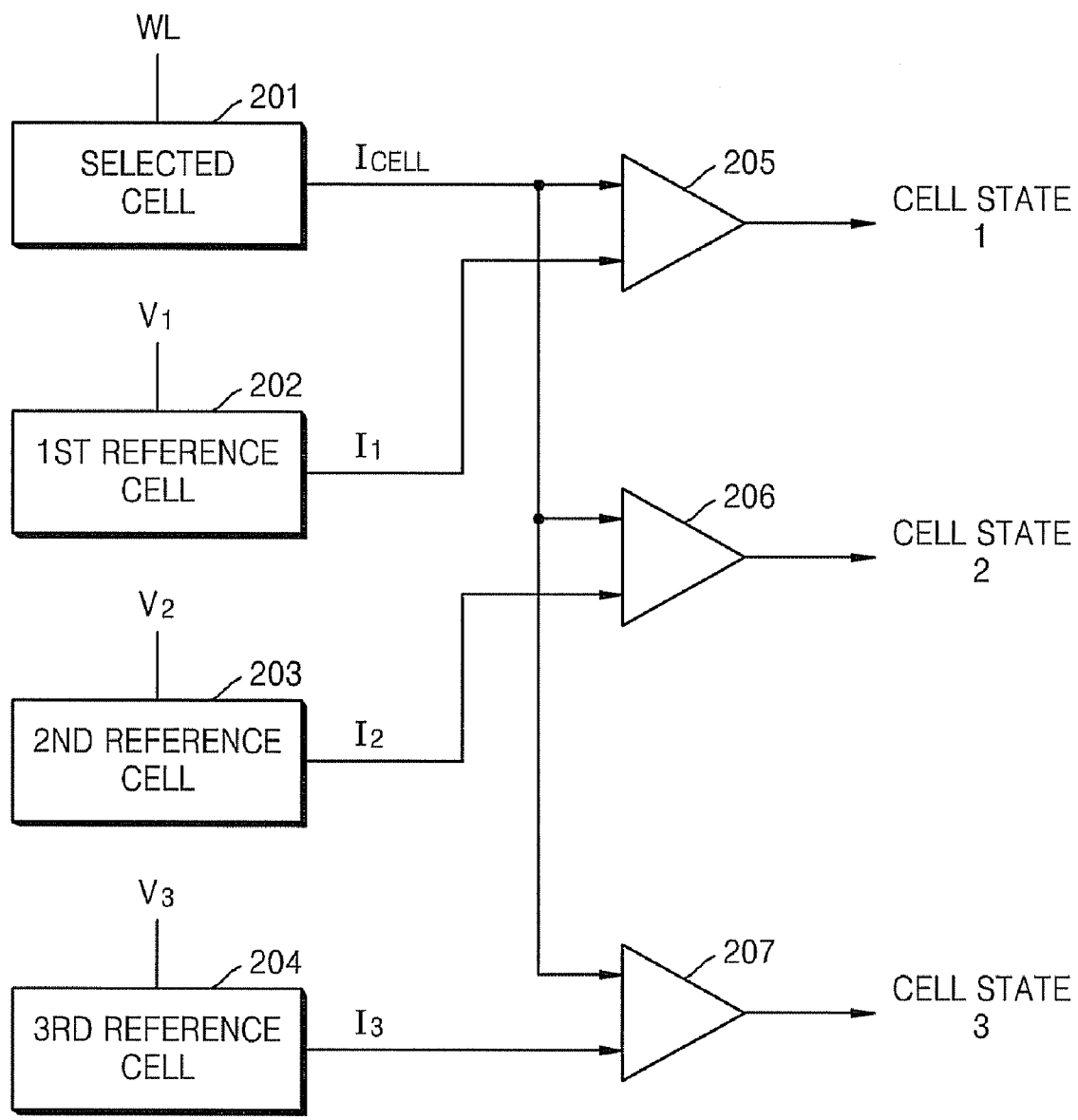
FIG. 2 is a diagram illustrating an example of determining a binary signal of one memory cell in a multi level cell (MLC) type memory according to conventional technology.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Aspects of the present invention provide a method and apparatus for determining a binary signal of a memory cell capable of decreasing a bit error rate when a binary signal of a memory cell is determined in a memory capable of storing one or more bits of data in one memory cell (such as in a flash memory).

In particular, in order to prevent an occurrence of an error in the determination of a binary signal of a target cell due to interference from a neighboring cell and/or noise, data stored in the target cell and data stored in at least one cell neighboring the target cell are collected. Then, by using a parameter indicating a correlation between the target cell and the neighboring cell and a parameter indicating a correlation between the data recorded in the target cell and reproduced data, the data collected in the target cell is corrected using the collected data and a binary signal of the target cell is determined.

Figure 3:
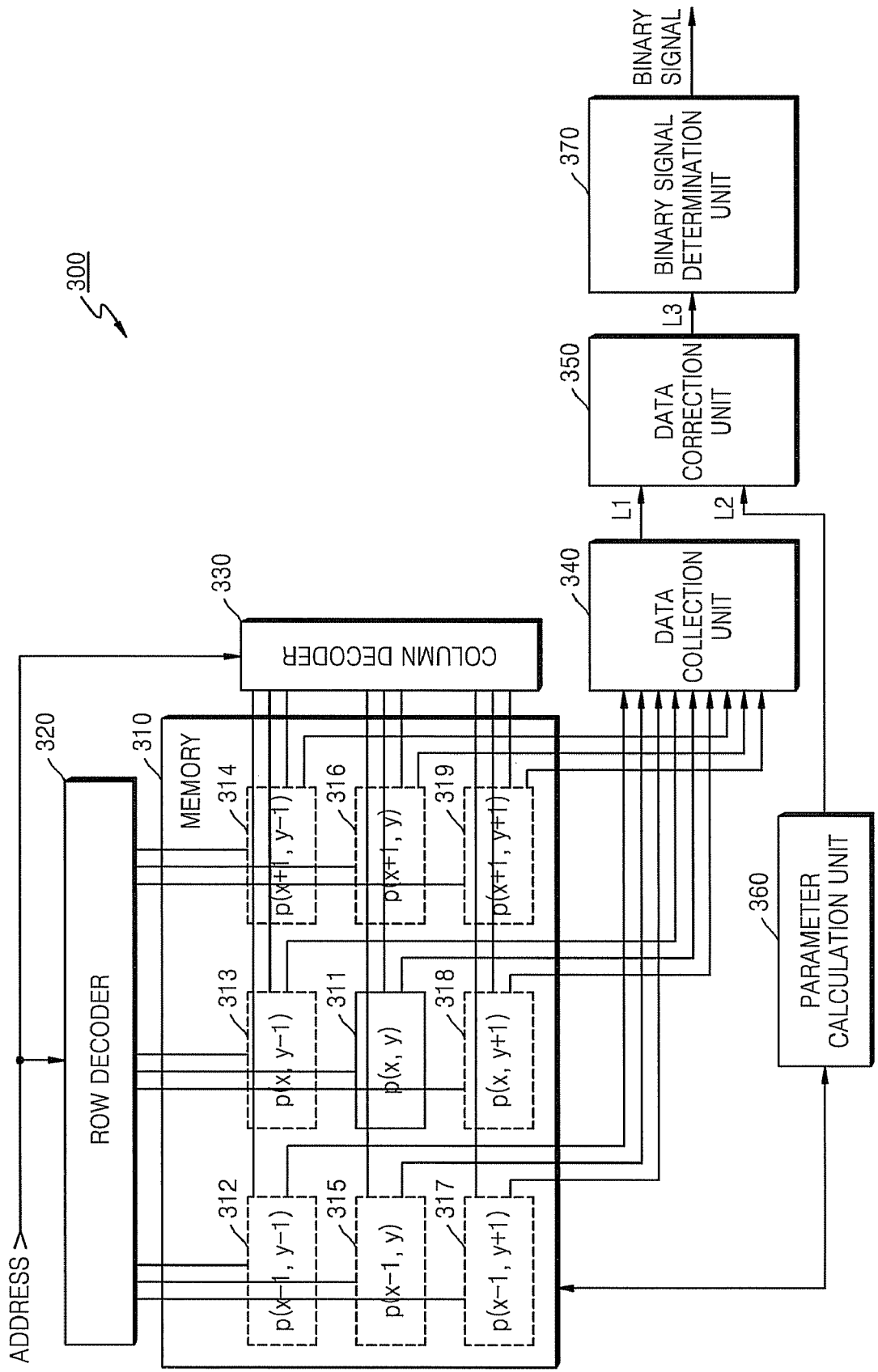
FIG. 3 is a functional block diagram of an apparatus to determine a binary signal of a memory cell according to an embodiment of the present invention.

FIG. 3 is a functional block diagram of an apparatus 300 to determine a binary signal of a memory cell according to an embodiment of the present invention. Referring to FIG. 3, the apparatus 300 to determine a binary signal of a memory cell includes a memory 310, a row decoder 320, a column decoder 330, a data collection unit 340, a data correction unit 350, a parameter calculation unit 360, and a binary signal determination unit 370.

The memory 310 has a plurality of cells. As an example, the memory 310 may be a flash memory. Each cell stores at least 1-bit information, and in the case of the flash memory, the cell may be formed as floating gate transistors. If one stage electrical charge is stored in a floating gate, then 1-bit information is stored in the cell. If two stage electrical charges are stored in a floating gate, then 2-bit information is stored in the cell. Accordingly, if multiple stage charges are stored in a floating gate, then multiple-bit information is stored in the cell. In the current embodiment, for convenience of explanation, a case where 1-bit information is stored in each cell included in the memory 310 will be explained.

Hereinafter, a cell 311 of which a binary signal is to be determined from among cells included in the memory 310 will be referred to as a target cell 311, and a cell 312 through 319 physically neighboring the target cell 311 will be referred to as a neighboring cell 312 through 319. In the embodiment illustrated in FIG. 3, a cell 311 corresponds to a target cell, and cells 312 through 319 correspond to neighboring cells. However, according to aspects of the present invention, one or more cells can be used as a neighboring cell 312 through 319. For example, by using only the neighboring cell 312, or by using only the neighboring cells 312 and 313, the current embodiment can be implemented in order to determine a binary signal of the target cell 311.

The row decoder 320 generates a plurality of row selection signals for the memory 310 from an input address. The column decoder 330 generates a plurality of column selection signals for the memory 310 from an input address. In the embodiment illustrated in FIG. 3, the row decoder 320 generates three row selection signals, and the column decoder 330 generates three column selection signals. Accordingly, by combining the three row selection signals generated in the row decoder 320 and the three column selection signals generated in the column decoder 330, data stored in the target cell 311 and the neighboring cells 312 through 319 are simultaneously transmitted to the data collection unit 340.

It is understood that aspects of the present invention are not limited to three row selections and three column selections.

Furthermore, according to other aspects, the data need not be simultaneously transmitted. For example, the apparatus 300 according to the current embodiment may also be implemented as a conventional apparatus such that the row decoder 320 generates one row selection signal from an input address, and the column decoder 330 generates one column selection signal from an input address in order to sequentially transmit data stored in the target cell 311 and the eight neighboring cells 312 through 319.

If the data stored in the target cell 311 and the neighboring cells 312 through 319 is received, the data collection unit 340 collects binary data of the data stored in the neighboring cells 312 through 319. That is, based on a comparison of a preset reference value with the data received from the neighboring cells 312 through 319, binary data of the data stored in the neighboring cells 312 through 319 is obtained. For example, if the preset reference value is 0.5 and each of the data values received from the neighboring cells 312 through 319 is less than 0.5, the data collection unit 340 obtains binary data corresponding to 0. Similarly, if each of the data values received from the neighboring cells 312 through 319 is equal to or greater than 0.5, the data collection unit 340 obtains binary data corresponding to 1.

In this way, when the binary data expressed with 0 and/or 1 for the data stored in the neighboring cells 312 through 319 is collected, the data collection unit 340 transmits, through a transmission line L1, the data collected from the target cell 311 and the binary data of the data stored in the neighboring cells 312 through 319 to the data correction unit 350.

If 1-bit information is stored in each cell and the number of neighboring cells 312 through 319 to be considered is eight (as illustrated in FIG. 3), the data transmitted through the transmission line L1 is nine 1-bit information items. However, if 2-bit information is stored in each cell and the number of neighboring cells 312 through 319 to be considered is eight (as illustrated in FIG. 3), the data transmitted through the transmission line L1 is nine 2-bit information items. Similarly, if 1-bit information is stored in each cell and the number of neighboring cells 312 through 319 to be considered is one, the data transmitted through the transmission line L1 is two 1-bit information items.

The data correction unit 350 corrects the data collected from the target cell 311. Specifically, the data correction unit 350 uses the data collected from the target cell 311 and the binary data of the data stored in the neighboring cells 312 through 319 that are provided by the data collection unit 340 and parameters to correct the data.

That is, assuming that the data collected from the target cell 311 is R(x,y), R(x,y) can be defined as Equation 1 below:

$$R(x, y) = H(-1, -1)P(x-1, y-1) + H(0, -1)P(x, y-1) + H(+1, -1)P(x+1, y-1) + H(-1, 0)P(x-1, y) + H(0, 0)P(x, y) + H(+1, 0)P(x+1, y) + H(-1, +1)P(x-1, y+1) + H(0, +1)P(x, y+1) + H(+1, +1)P(x+1, y+1) + \text{offset}$$ (Equation 1), where H denotes the parameter. The parameter includes a parameter indicating a correlation between the data stored in the target cell 311 and the data stored in the neighboring cells, and a parameter indicating a correlation between the data recorded in the target cell 311 and data reproduced from the target cell 311.

That is, H(−1,−1) is a parameter indicating a correlation between the data stored in the target cell 311 and the data stored in the neighboring cell 312. H(0,−1) is a parameter indicating a correlation between the data stored in the target cell 311 and the data stored in the neighboring cell 313. H(+1,−1) is a parameter indicating a correlation between the data stored in the target cell 311 and the data stored in the neighboring cell 314. H(−1,0) is a parameter indicating a correlation between the data stored in the target cell 311 and the data stored in the neighboring cell 315. H(0,0) is a parameter indicating a correlation between the data recorded in the target cell 311 and the data reproduced from the target cell 311. H(+1,0) is a parameter indicating a correlation between the data stored in the target cell 311 and the data stored in the neighboring cell 316. H(−1,+1) is a parameter indicating a correlation between the data stored in the target cell 311 and the data stored in the neighboring cell 317. H(0,+1) is a parameter indicating a correlation between the data stored in the target cell 311 and the data stored in the neighboring cell 318. H(+1,+1) is a parameter indicating a correlation between the data stored in the target cell 311 and the data stored in the neighboring cell 319.

The parameters can be defined as a parameter expressing in numbers the degree that the data stored in the target cell 311 is affected by the data stored in the neighboring cell 312 through 319, and a parameter expressing in numbers the degree of a correlation between the binary data recorded in the target cell 311 and the data reproduced from the target cell 311. The parameter calculation unit 360 provides these parameters.

Figure 4:
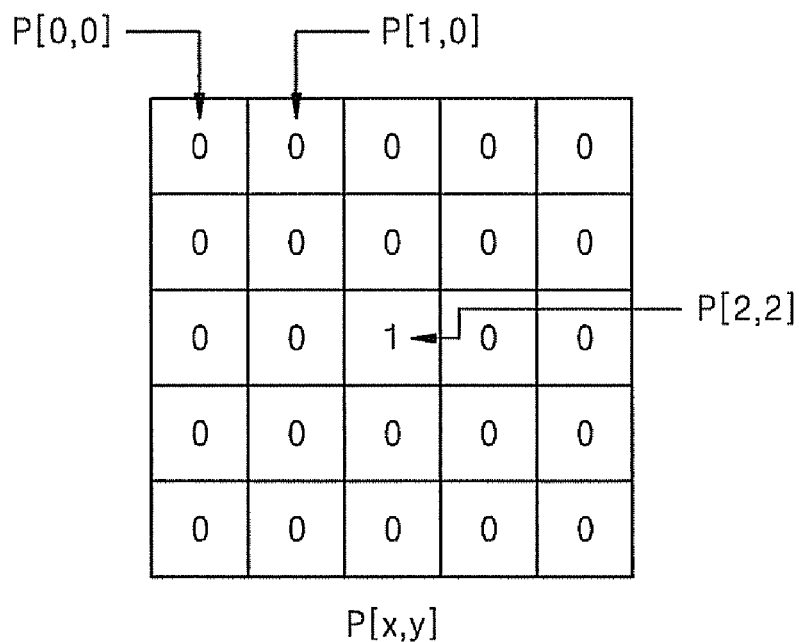
FIG. 4 is a diagram illustrating an example of data P(x,y) corresponding to a 5×5 cell array recorded in a predetermined area of a memory in order to obtain an H parameter according to an embodiment of the present invention.

Whenever the memory 310 operates, the parameter calculation unit 360 performs an operation to obtain parameters in relation to a predetermined area of the memory 310. The predetermined area can be referred to as a test area. Since the parameter is calculated based on the relationship between binary data recorded in a cell and binary data reproduced from the cell, the parameter calculation unit 360 first records data that is already known in the predetermined area of the memory 310. For example, the parameter calculation unit 360 records binary data P(x,y) of a 5×5 cell array in a predetermined area of the memory 410, as illustrated in FIG. 4. However, it is understood that aspects of the present invention are not limited to a 5×5 cell array, and a different sized cell array may be used.

FIG. 4 is a diagram illustrating an example of binary data P(x,y) corresponding to the 5×5 cell array recorded in the predetermined area of the memory 310 in order to obtain an H parameter according to an embodiment of the present invention. Referring to FIG. 4, the parameter calculation unit 360 records binary data corresponding to 1 in only one cell P(2,2) in the 5×5 cell array, and binary data corresponding to 0 in the remaining cells. When the reproduced data R(x,y) is obtained by reproducing the recorded data, it can be known that data reproduced for a cell that is not affected by neighboring cells or noise is 0.3 or 0.9.

Figure 5:
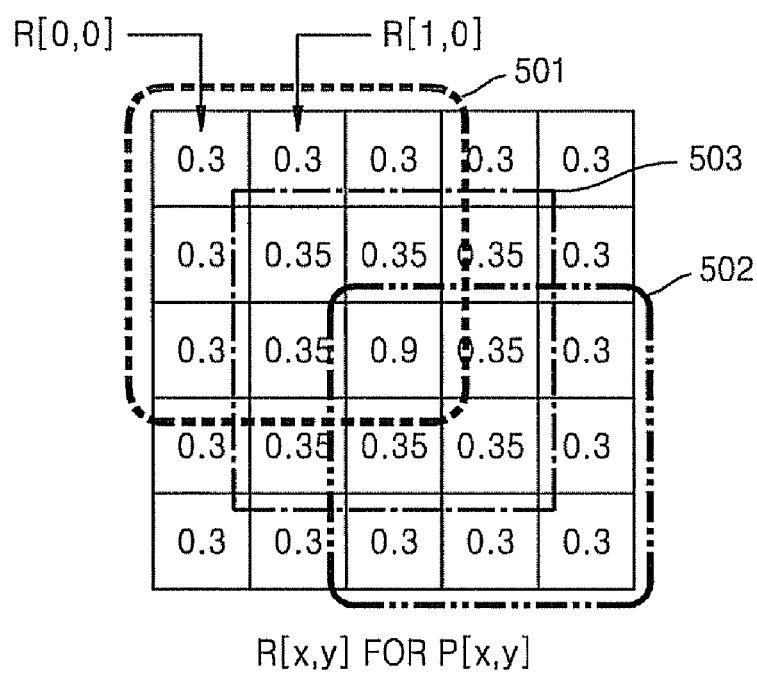
FIG. 5 is a diagram illustrating an example of reproduction data R(x,y) corresponding to data illustrated in FIG. 4 according to an embodiment of the present invention.

FIG. 5 is a diagram illustrating an example of reproduction data R(x,y) corresponding to the binary data P(x,y) recorded as illustrated in FIG. 4 according to an embodiment of the present invention. Referring to FIG. 5, in an area 501, the reproduced data at R(1,1), R(1,2), and R(2,1) has values slightly greater than 0.3. This indicates that the reproduced data at the locations R(1,1), R(1,2), and R(2,1) in the area 501 is affected by neighboring cells or noise. Areas 501, 502, and 502 illustrated in FIG. 5 are determined according to the structure of H parameters. That is, as the parameter calculation unit 360 is implemented in order to calculate H parameters having a 3×3 cell structure, areas 501, 502, and 503 illustrated in FIG. 5 are set and the H parameters are calculated. If the parameter calculation unit 360 is implemented in order to calculate H parameters having a 4×4 cell structure, areas 501, 502, and 503 illustrated in FIG. 5 are each changed to a 4×4 cell structure.

A process of obtaining H(+1,+1) corresponding to R(+1,+1) in the parameter calculation unit 360 when data as illustrated in FIG. 4 is recorded and data as illustrated in FIG. 5 is reproduced will now be explained. First, an equation for obtaining R(+1,+1) in FIG. 5 can be defined as Equation 2 below:

$$R(+1,+1)=H(-1,-1)P(0,0)+H(0,-1)P(1,0)+H(+1,-1)P(2,0)+H(-1,0)P(0,1)+H(0,0)P(1,1)+H(+1,0)P(2,1)+H(-1,+1)P(0,2)+H(0,+1)P(1,2)+H(+1,+1)P(2,2)+\text{offset} \quad \text{(Equation 2)}$$

where the offset is a voltage (or current) value that is basically detected even when nothing is recorded in a memory cell. In the case illustrated in FIG. 5, 0.3 is the offset value that basically exists. In the area 501 illustrated in FIG. 5, R(+1,+1) is 0.35 and P values except P(2,2) are all 0s based on the values as defined in FIG. 4. If these values are put into Equation 2, Equation 2 becomes Equation 3 below:

$$0.35=H(+1,+1)+0.3 \quad \text{(Equation 3)}.$$

Figures 6, 7A:
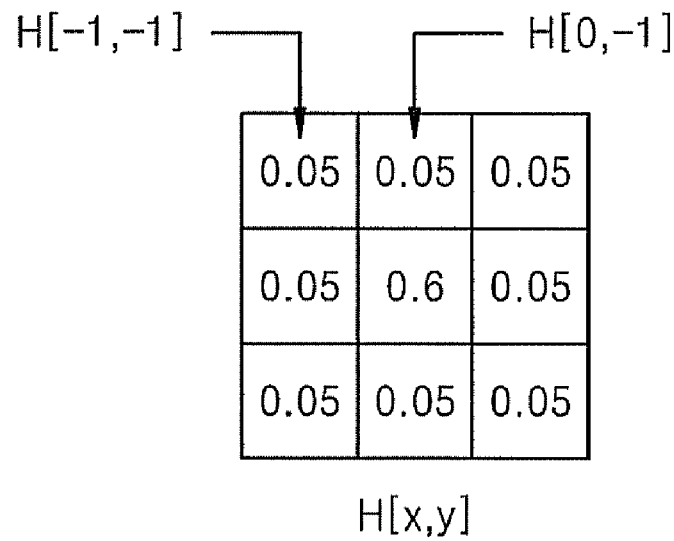

If equation 3 is calculated in relation to H(+1,+1), H(+1,+1) is determined to be 0.05. Accordingly, the value 0.05 is set at the location H(+1,+1) as illustrated in FIG. 6. FIG. 6 is a diagram illustrating H parameters obtained based on data illustrated in FIGS. 4 and 5 according to an embodiment of the present invention.

The H parameter at the location H(−1,−1) is obtained by moving the area 501 to the area 502 illustrated in FIG. 5. As the area 501 is moved to the area 502 illustrated in FIG. 5, all 0s are recorded in the remaining cells excluding the cell corresponding the location R(−1,−1), and Equation 2 becomes Equation 4 below:

$$0.35=H(-1,-1)+0.3 \quad \text{(Equation 4)}.$$

If equation 4 is calculated in relation to H(−1,−1), H(−1,−1) is determined to be 0.05.

Accordingly, the value 0.05 is set at the location H(−1,−1) as illustrated in FIG. 6.

In order to obtain the H parameter at the location H(0,0), the area 501 illustrated in FIG. 5 is moved to the area 503. Accordingly, Equation 2 becomes Equation 5 below:

$$0.9=H(0.0)+0.3 \quad \text{(Equation 5)}.$$

If equation 5 is calculated in relation to H(0,0), H(0,0) is determined to be 0.6. Accordingly, the value 0.6 is set at the location H(0,0), as illustrated in FIG. 6.

H parameters corresponding to the 3×3 cell structure are obtained as illustrated in FIG. 6 according to the parameter calculations described above. The parameter calculation unit 360 provides the obtained parameter values to the data correction unit 350 through a transmission line L2. That is, when H parameters are obtained as illustrated in FIG. 6, nine H parameters are transmitted through the transmission line L2.

The data correction unit 350 corrects the data R(x,y) collected from the target cell 311 based on Equation 1, provided above. That is, based on P(x,y) expressed in Equation 1, Equation 1 is redefined as Equation 6 below, and P(x,y), which is the reference for the redefining, is defined as corrected data of R(x,y), which is data collected from the target cell 311:

$$P(x,y)=(R(x,y)-(H(-1,-1)P(x-1,y-1)+H(0,-1)P(x,y-1)+H(+1,-1)P(x+1,y-1)+H(-1,0)P(x-1,y)+H(+1,0)P(x+1,y)+H(-1,+1)P(x-1,y+1)+H(0,+1)P(x,y+1)+H(+1,+1)P(x+1,y+1)+\text{offset}))/H(0,0) \quad \text{(Equation 5)}$$

In Equation 6, obtained parameters as illustrated in FIG. 6 are entered for the H parameters. That is, 0.6 is entered for H(0,0) and 0.05 is entered for other H parameters. Furthermore, in Equation 6, binary data of neighboring cells collected in the data collection unit 340 is entered for the P values on the right-hand side. For example, binary data of the neighboring cell 312 is entered for P(x−1,y−1). Moreover, the data stored in the target cell 311 collected in the data collection unit 340 is entered for R(x,y). The offset is a voltage (or current) value that is basically detected even when nothing is recorded in a memory cell, and 0.3 is the offset value that basically exists as illustrated in FIG. 5. It is understood that aspects of the present invention are not limited to 0.3 as the offset value.

In this way, the data correction unit 350 obtains data P(x,y) obtained by correcting the data R(x,y) stored in the target cell 311, by using the data collected from the target cell 311, H parameters, the binary data of the neighboring cells 312 through 310 collected from the data collection unit 340, and the offset. The obtained corrected data P(x,y) is transmitted to the binary signal determination unit 370 through a transmission line L3.

The binary signal determination unit 370 determines a binary signal for the data P(x,y) obtained by correcting the data R(x,y) stored in the target cell 311. That is, a preset reference value is compared to the data P(x,y) obtained in the data correction unit 350, and the comparison result is output as the binary signal of the corrected data P(x,y).

An example based on FIGS. 3 through 6 described above is illustrated in FIGS. 7A through 7d. FIGS. 7A through 7D are diagrams illustrating a process of determining a binary signal of a memory cell by using the apparatus 300 to determine a binary signal of a memory cell illustrated in FIG. 3 according to an embodiment of the present invention.

As illustrated in FIG. 7A, binary data is recorded in the memory 310. Then, as illustrated in FIG. 7B, the recorded binary data is reproduced, so that the data collection unit 340 obtains a P value of a neighboring cell to be used in Equation 6 with the reference value being 0.6. If the corrected data P(x,y) is obtained by correcting R(x,y) reproduced in the target cell by using the P value of the neighboring cell, and H parameters and an offset are obtained as described with reference to FIGS. 4 through 6, the data illustrated in FIG. 7B is corrected as illustrated in FIG. 7C. In order to obtain the binary signal of the corrected data as illustrated in FIG. 7C, if the reference value is compared with the corrected data illustrated in FIG. 7C, binary signals as illustrated in FIG. 7D are obtained. When FIGS. 7A and 7D are compared, it can be seen that data identical to the data recorded in the memory cell 311 is reproduced. Also, when FIGS. 7B and 7C are compared, it can be seen that in the case illustrated 7B, the distribution of data is widely spread due to the effect of neighboring cells, while the case illustrated in FIG. 7C has a smaller deviation than that illustrated in FIG. 7B and has a consistent distribution.

Figure 8:
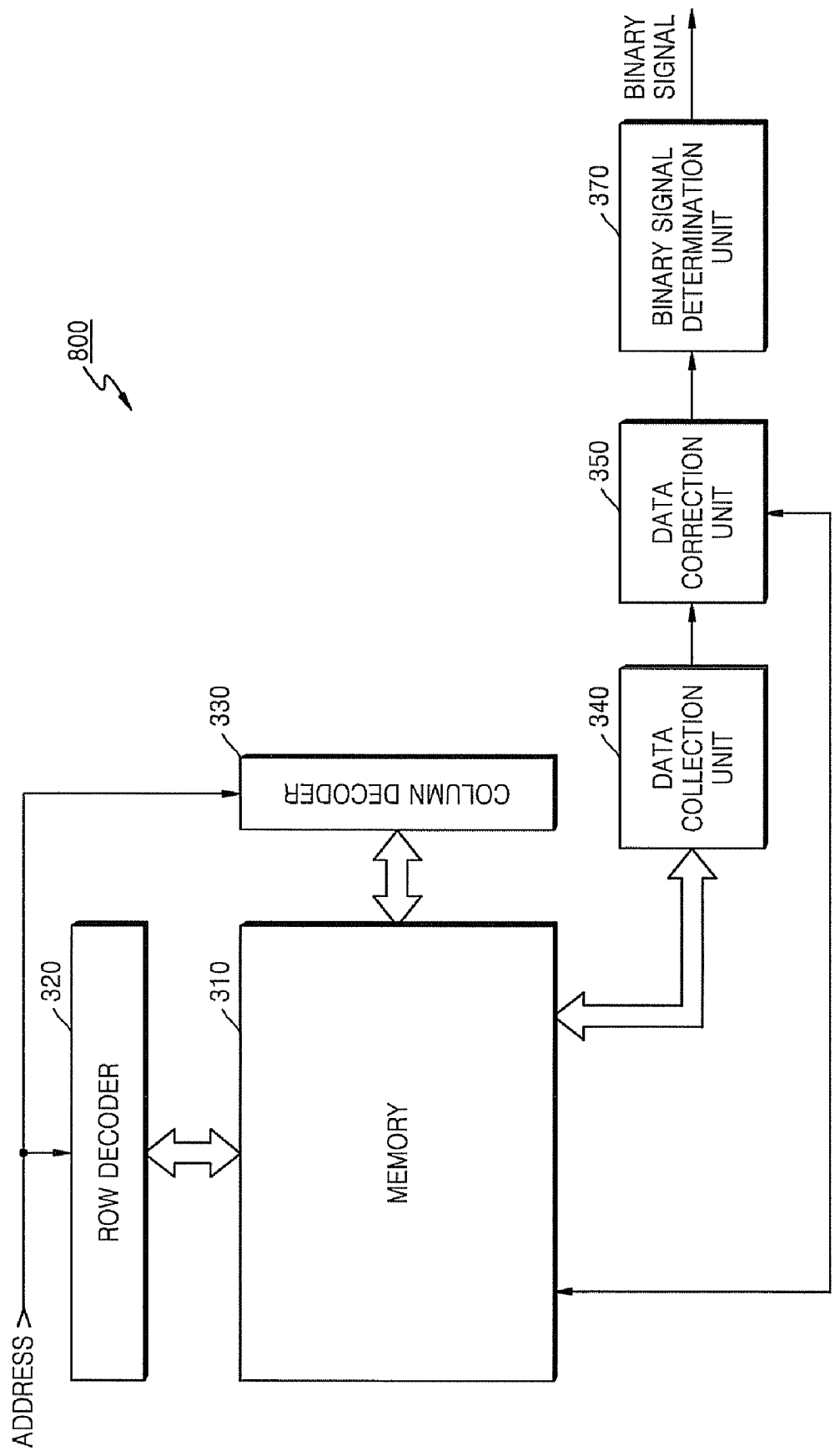
FIG. 8 is a functional block diagram of an apparatus to determine a binary signal of a memory cell according to another embodiment of the present invention.

FIG. 8 is a functional block diagram of an apparatus 800 to determine a binary signal of a memory cell according to another embodiment of the present invention. FIG. 8 illustrates a case in which H parameters are stored in advance in a predetermined area of a memory 310 and used, unlike the apparatus 300 illustrated in FIG. 3. Accordingly, the apparatus 800 to determine a binary signal of a memory cell illustrated in FIG. 8 does not have the parameter calculation unit 360 illustrated in FIG. 3, and has a structure in which parameters stored in the memory are directly transmitted to a data correction unit 350. Except for this feature, other elements in the apparatus 800 illustrated in FIG. 8 operate similarly to those of the apparatus 300 illustrated in FIG. 3, and will therefore note be described here.

Figure 9:
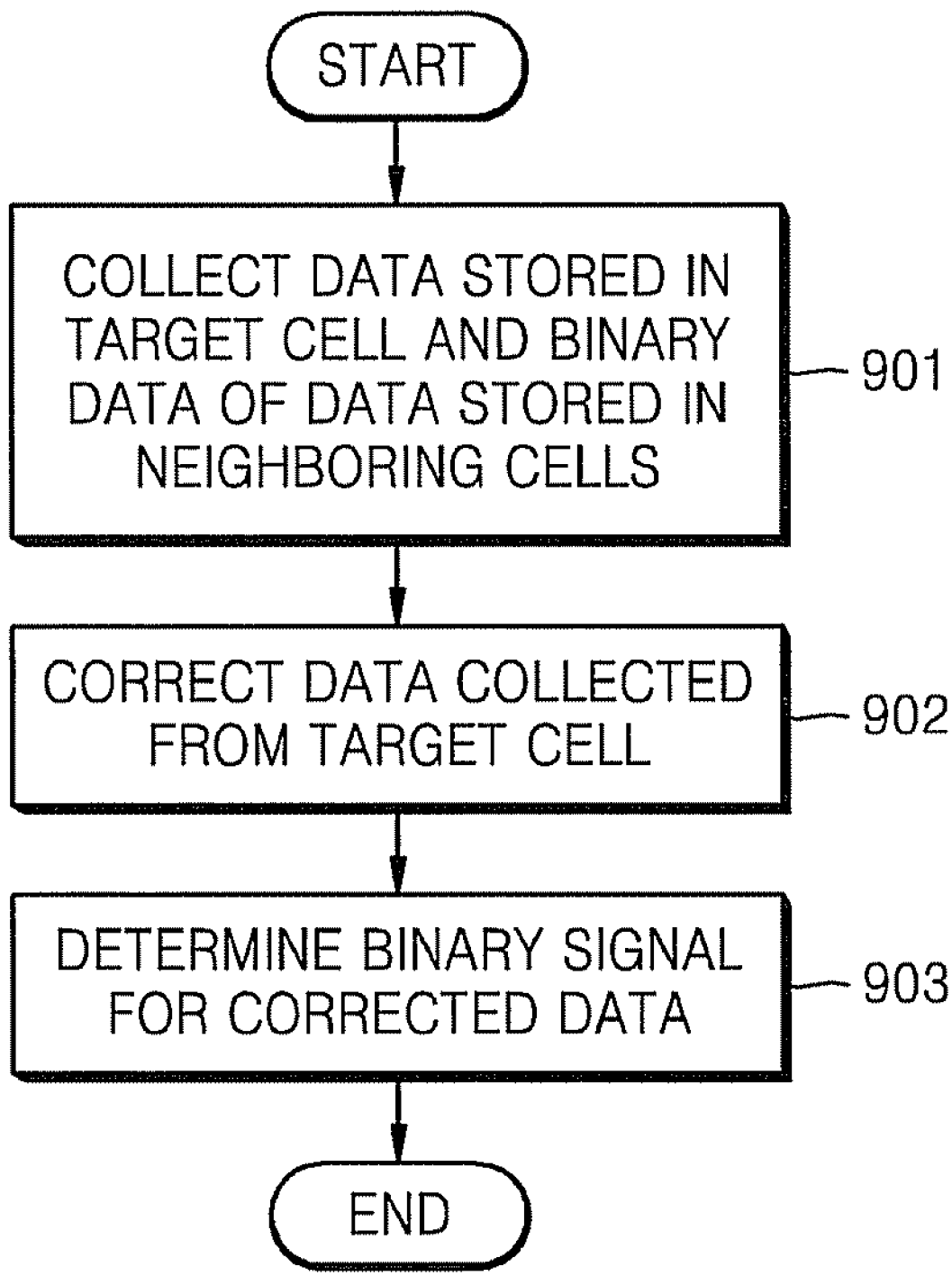
FIG. 9 is an operation flowchart illustrating a method of determining a binary signal of a memory cell according to an embodiment of the present invention.

FIG. 9 is an operation flowchart illustrating a method of determining a binary signal of a memory cell according to an embodiment of the present invention. The operation flowchart illustrated in FIG. 9 will now be explained with reference to FIG. 3.

First, data stored in the target cell 311 included in the memory 310 and binary data of data stored in at least one neighboring cell 312 through 319 that neighbors the target cell 311 are collected in operation 901. Collection of the binary data of the data stored in the neighboring cells 312 through 319 is performed based on a comparison of a preset reference value and the data collected from the neighboring cells 312 through 319 as described above in relation to the data collection unit 340 illustrated in FIG. 3.

Next, by using the collected data, parameters, and an offset, the data collected from the target cell 311 is corrected in operation 902. The parameters include a parameter indicating a correlation between the target cell 311 and the neighboring cells 312 through 319, and a parameter indicating a correlation between the data recorded in the target cell 311 and the data reproduced from the target cell 311. Parameters may be obtained through a separate parameter calculation process operating as in the parameter calculation unit 360 illustrated in FIG. 3, or may be predetermined (i.e., stored in advance in a predetermined area of the memory 310). If a parameter is obtained through a separate parameter calculation process, the method of determining a binary signal of a memory cell illustrated in FIG. 9 may further include an operation of obtaining a parameter from a predetermined area of the memory 310 whenever the memory 310 operates. The flowchart illustrated in FIG. 9 may be modified so that the operation for obtaining a parameter can be included before operation 901 or before operation 902 illustrated in FIG. 9.

In operation 902, correction of the data collected from the target cell 311 by using the collected data, the predetermined parameters, and offset is performed in the same manner as explained with reference to the data correction unit 350 illustrated in FIG. 3.

Next, a binary signal of the corrected data is determined in operation 903. The determination of the binary signal for the corrected data is performed in the same manner as explained with reference to the binary signal determination unit 370 illustrated in FIG. 3.

Furthermore, the method of determining a binary signal of a memory cell illustrated in FIG. 9 can also be applied to a memory in which one or more bit data is stored in a memory cell.

According to aspects of the present invention, a binary signal of data stored in a target cell is determined by using the data stored in the target cell, data stored in at least one cell neighboring the target cell, a parameter indicating a correlation between the target cell and the neighboring cell, and a parameter indicating a correlation between the data recorded in the target cell and reproduced data. By doing so, the effect of neighboring cells and noise can be reduced, thereby decreasing the bit error rate of the target cell. Accordingly, the amount of information separately stored in a memory in order to decrease a bit error rate (for example, parity information) can be reduced, thereby increasing a memory capacity to store user data.

Also, when a binary signal of a memory cell is determined according to aspects of the present invention without decreasing the amount of information separately stored in a memory in order to decrease a bit error rate, the bit error rate of the memory cell can be further decreased, thereby enhancing reliability of the product.

Furthermore, when a binary signal of a memory cell is determined, interference by a neighboring cell is compensated for, and thus the amount of the distribution of the binary signal of the memory cell is decreased. Accordingly, a memory can be implemented in which more data than 2 bits can be stored in one memory cell.

Aspects of the present invention can also be embodied as computer-readable codes on a computer-readable recording medium. The computer-readable recording medium is any data storage device that can store data which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer readable code is stored and executed in a distributed fashion.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An apparatus to determine a binary signal of a cell in a memory, the apparatus comprising:
a data collection unit to collect target data stored in a target cell in the memory and binary neighboring data of data stored in at least one neighboring cell that neighbors the target cell;
a data correction unit to correct the target data collected from the target cell by using the target data and the binary neighboring data collected by the data collection unit and parameter information; and
a binary signal determination unit to determine a binary signal of a corrected signal output from the data correction unit.

2. The apparatus as claimed in claim 1, wherein the parameter information comprises one or more parameter values indicating a correlation between the target data stored in the target cell and the data stored in the at least one neighboring cell, and a parameter value indicating a correlation between the target data recorded in the target cell and the target data reproduced from the target cell.

3. The apparatus as claimed in claim 1, wherein the target data stored in the target cell is 1-bit information.

4. The apparatus as claimed in claim 1, wherein the target data stored in the target cell is greater than 1 bit.

5. The apparatus as claimed in claim 1, further comprising:
a row decoder to generate a plurality of row selection signals in the memory from an address; and
a column decoder to generate a plurality of column selection signals in the memory from the address in order to simultaneously transmit the target data stored in the target cell and the data of the at least one neighboring cell to the data collection unit.

6. The apparatus as claimed in claim 1, wherein the parameter information is predetermined parameter information stored in a predetermined area of the memory.

7. The apparatus as claimed in claim 1, further comprising a parameter calculation unit to calculate the parameter information in a predetermined area of the memory whenever the memory operates.

8. The apparatus as claimed in claim 1, wherein the data collection unit determines the binary neighboring data of the data stored in the at least one neighboring cell by comparing a preset reference value with the data collected from each of the at least one neighboring cell.

9. The apparatus as claimed in claim 8, wherein the data correction unit corrects the target data collected from the target cell by further using an offset.

10. The apparatus as claimed in claim 2, further comprising a parameter calculation unit to calculate the parameter information in a test area of the memory by recording predetermined binary data in the test area, reproducing the predetermined binary data from the test area, and comparing the actual predetermined binary data with the reproduced predetermined binary data.

11. The apparatus as claimed in claim 10, wherein the parameter calculation unit calculates the parameter information by comparing the actual predetermined binary data with the reproduced predetermined binary data in consideration of an offset value.

12. The apparatus as claimed in claim 10, wherein the parameter calculation unit records the predetermined binary data in a cell array having a predetermined size.

13. The apparatus as claimed in claim 12, wherein the parameter calculation unit records binary data having a value of 1 in only one cell of the cell array.

14. The apparatus as claimed in claim 12, wherein the cell array has a greater number of cells than a sum of one and a number of neighboring cells.

15. The apparatus as claimed in claim 1, wherein parity information is not stored in the memory to be used to determine the binary signal of the cell.

16. A method of determining a binary signal of a cell in a memory, the method comprising:
    collecting target data stored in a target cell in the memory and binary neighboring data of data stored in at least one neighboring cell that neighbors the target cell;
    correcting the target data collected from the target cell by using the collected target data and the binary neighboring data and parameter information; and
    determining a binary signal of the corrected data.

17. The method as claimed in claim 16, wherein the parameter information comprises one or more parameter values indicating a correlation between the target data stored in the target cell and the data stored in the at least one neighboring cell, and a parameter value indicating a correlation between the target data recorded in the target cell and the target data reproduced from the target cell.

18. The method as claimed in claim 16, wherein the target data stored in the target cell is 1-bit information.

19. The method as claimed in claim 16, wherein the target data stored in the target cell is greater than 1 bit.

20. The method as claimed in claim 16, wherein the parameter information is predetermined parameter information stored in a predetermined area of the memory.

21. The method as claimed in claim 16, further comprising calculating the parameter information in a predetermined area of the memory whenever the memory operates.

22. The method as claimed in claim 16, wherein the collecting of the binary neighboring data comprises determining the binary neighboring data of the data stored in the at least one neighboring cell by comparing a preset reference value with the data collected from each of the at least one neighboring cell.

23. The method as claimed in claim 22, wherein the correcting of the target data comprises correcting the target cell by using the collected target data and the binary neighboring data, parameter information, and an offset.

24. The method as claimed in claim 17, further comprising calculating the parameter information in a test area of the memory by recording predetermined binary data in the test area, reproducing the predetermined binary data from the test area, and comparing the actual predetermined binary data with the reproduced predetermined binary data.

25. The method as claimed in claim 24, wherein the calculating of the parameter information comprises calculating the parameter information by comparing the actual predetermined binary data with the reproduced predetermined binary data in consideration of an offset value.

26. The method as claimed in claim 24, wherein the calculating of the parameter information comprises recording the predetermined binary data in a cell array having a predetermined size.

27. The method as claimed in claim 26, wherein the cell array has a greater number of cells than a sum of one and a number of neighboring cells.

28. The method as claimed in claim 16, wherein parity information is not stored in the memory to be used to determine the binary signal of the cell.

29. The method as claimed in claim 17, wherein the parameter information is determined according to an equation, or variants thereof according to a number of neighboring cells used, the equation being:

$$R(x, y) = H(-1, -1)P(x-1, y-1) + H(0, -1)P(x, y-1) +$$
$$H(+1, -1)P(x+1, y-1) + H(-1, 0)P(x-1, y) +$$
$$H(0, 0)P(x, y) + H(+1, 0)P(x+1, y) + H(-1, +1)P(x-1, y+1) +$$
$$H(0, +1)P(x, y+1) + H(+1, +1)P(x+1, y+1) + \text{an Offset,}$$

where R represents actual data recorded on a cell, H represents the parameter information, and P represents data reproduced from the cell.

30. A computer readable recording medium encoded with the method of claim 16 and implemented by a computer.

31. An apparatus to correct data of a cell in a memory, the apparatus comprising:
    a data collection unit to collect target data stored in a target cell in the memory and binary neighboring data of data stored in at least one neighboring cell that neighbors the target cell; and
    a data correction unit to correct the target data collected from the target cell by using the target data and the binary neighboring data collected by the data collection unit and parameter information.

32. A memory storing data that is corrected by a correcting apparatus, the memory comprising:
    a target cell storing target data to be corrected by the correcting apparatus;
    at least one neighboring cell storing neighboring data to be used with the target data and parameter information by the correcting apparatus to correct the target data; and
    a test area on which the correcting apparatus calculates the parameter information by recording predetermined binary data thereon, reproducing the predetermined binary data therefrom, and comparing the actual predetermined binary data with the reproduced predetermined binary data.

* * * * *